(12) United States Patent
Ho

(10) Patent No.: US 6,240,028 B1
(45) Date of Patent: May 29, 2001

(54) SIMPLIFIED PERIPHERAL LOGIC FOR MEMORY DEVICE

(75) Inventor: Duc V. Ho, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/589,405

(22) Filed: Jun. 8, 2000

(51) Int. Cl.⁷ .................................................. G11C 7/00
(52) U.S. Cl. ................ 365/194; 365/189.05; 365/230.08
(58) Field of Search .............................. 365/194, 230.08, 365/230.06, 233, 189.05

(56) References Cited

U.S. PATENT DOCUMENTS 4,789,960 * 12/1988 Willis ................................... 365/189
5,796,675 * 8/1998 Jang ................................. 365/230.08
5,896,341 * 4/1999 Takahashi ....................... 365/230.06
6,101,135 * 8/2000 Lee ........................................ 365/191

* cited by examiner

*Primary Examiner*—Son T. Dinh
(74) *Attorney, Agent, or Firm*—Dickstein Shapiro Morin & Oshinsky, LLP

(57) ABSTRACT

A simplified address decoding and data application circuitry is provided for a double data rate memory device in which a plurality of delay elements normally used during a write operation to synchronize the timing of address data, with respect to a clock signal, are replaced by a single delay element which applies a delayed clock signal to operate shift register stages of the memory device during a write operation.

41 Claims, 5 Drawing Sheets

SIMPLIFIED PERIPHERAL LOGIC FOR MEMORY DEVICE

FIELD OF THE INVENTION

The present invention relates to a method and apparatus which simplifies the peripheral logic used in a memory device, particularly a high speed double data rate memory device.

BACKGROUND AND DISCUSSION OF RELATED ART

As memory density and speed continue to increase in memory devices and as the demand for ever larger memory arrays continues, the die real estate occupied by both the memory circuits and associated peripheral logic circuits is of critical importance. Particularly peripheral logic circuits are becoming very large and increasingly difficult to fit in a defined memory device area. In addition, when delay stages are required in the peripheral logic circuit, this further adds to the problem as delay stages are known for their large size due to the requirement for resistors, capacitors and metal options to produce different timing delays.

Delay elements are typically employed in high speed double data rate memory devices which require data shifters for shifting data in a write cycle. For example, in some double data rate memory devices it is known that a two clock cycle latency period is required before data, for example, address data, can be delivered to a memory core for a write operation from the time that the data is latched at an input buffer into the memory device.

The data shifters shift the latched data with the clock signal used to latch the data to allow the data to be delivered at the time necessary for a properly timed memory operation.

However, at all times, data leaving the shifters still arrives faster than desired, and delay stages are typically used to make sure that the data from the shifter outputs are delayed in synchronism with the clock loading new data into the input buffer, to thereby prevent incorrect memory access operations.

FIG. 1 illustrates, as an example, one prior art circuit which employs address data shifters and associated delay elements. The FIG. 1 circuit is utilized to produce bank addresses for a memory device on lines BA_W<$\phi$>, BA_W<1>, BA_W<2>, and BA_W<3>. These bank address lines are also designated by respective data output lines 29a . . . 29d. The bank addresses are derived from address data received on input lines 17a . . . 17d of input buffer 11. It should be noted that for purposes of simplification of explanation, only four data input lines 17a . . . 17d and four data output lines 29a . . . 29d are illustrated in FIG. 1. However, any number of input lines 17 and output lines 29 can be provided as needed for a particular memory device and the number of input lines 17 need not equal the number of output lines 29.

The noted bank address selection signals on lines 29a . . . 29d are generated from input data addresses which are applied as data in on input lines 17a . . . 17d of a memory device. The multi-bit address data is latched in by a clock signal on line 15 at each of the respective one-bit latches 13a . . . 13d which are provided in an input buffer circuit 11. The address data latched at the input buffer circuit 11 is in turn decoded by a decoder 13 to produce the bank address selection signals BA_W<0:3>. A shift register circuit 19 is provided, having individual shift register elements 29a . . . 29d which delay the decoded bank select signals by, for example, two cycles of the clock signal appearing on line 15. In addition, the shift register circuit 19 also has associated with each shift element 21a . . . 21d, a respective delay element 23a . . . 23d. The delay elements ensure that the bank select signals appearing on lines 29a . . . 29d are property synchronized with the clock signal 15 which is loading new address data into the latches 13a . . . 13d of input buffer 11.

As shown in FIG. 1, the output bank select data BA_W<0:3> at each of the delay circuits 23a . . . 23d are respectively provided to multiplexers 27a . . . 27d on a first path. The multiplexers also receive from decoder 13 the same bank select information on a second path, which does not pass through the shift register elements 21a . . . 21d or associated delay elements 23a . . . 23d. Mutltiplexers 27a . . . 27d are thus each provided with a shifted and delayed address signal on one input, and an unshifted, undelayed address signal on another input. The multiplexers 27a . . . 27d each select one of the applied inputs and provides it as an output in response to a selection signal denoted LWENA/LWENAi. The selection signal LWENA/LWENAi is thus used to select which of the outputs of the delay stage 23a or the unshifted undelayed output from decoder 13 is applied to the respective bank address signal lines 29a . . . 29d. When the selection signal LWENA/LWENAi goes high the shifted/delayed input of a multiplexer is selected, and when it goes low the unshifted/undelayed input is selected. Since the address information only needs to be shifted during a write operation, the selection signal goes high for a memory write operation and low for a memory read operation.

As illustrated by FIG. 6, to properly time the shifted data a delay 23a . . . 23d is associated with each of the shift register elements 21a . . . 21d. This requires a considerable amount of real estate on a die to implement the delay elements 23a . . . 23d for the reasons noted.

A simplified peripheral logic input data shift circuit which requires less delay elements would be desirable.

SUMMARY OF THE INVENTION

The present invention provides a simplified peripheral logic circuit to that shown in FIG. 1 in which the individual delay elements 23a . . . 23d are eliminated. Instead, a single delay element is provided in a clock signal path to provide a delayed clock signal which drives each of the individual shift register elements. As a consequence, only a single delay element is required instead of the plurality of delay elements previously used.

The foregoing as well as other advantages and features of the invention will be more readily understood from the following detailed description of the invention which is provided in connection with the accompanying drawings.

DETAILED DESCRIPTION OF THE DRAWINGS

Figure 1:
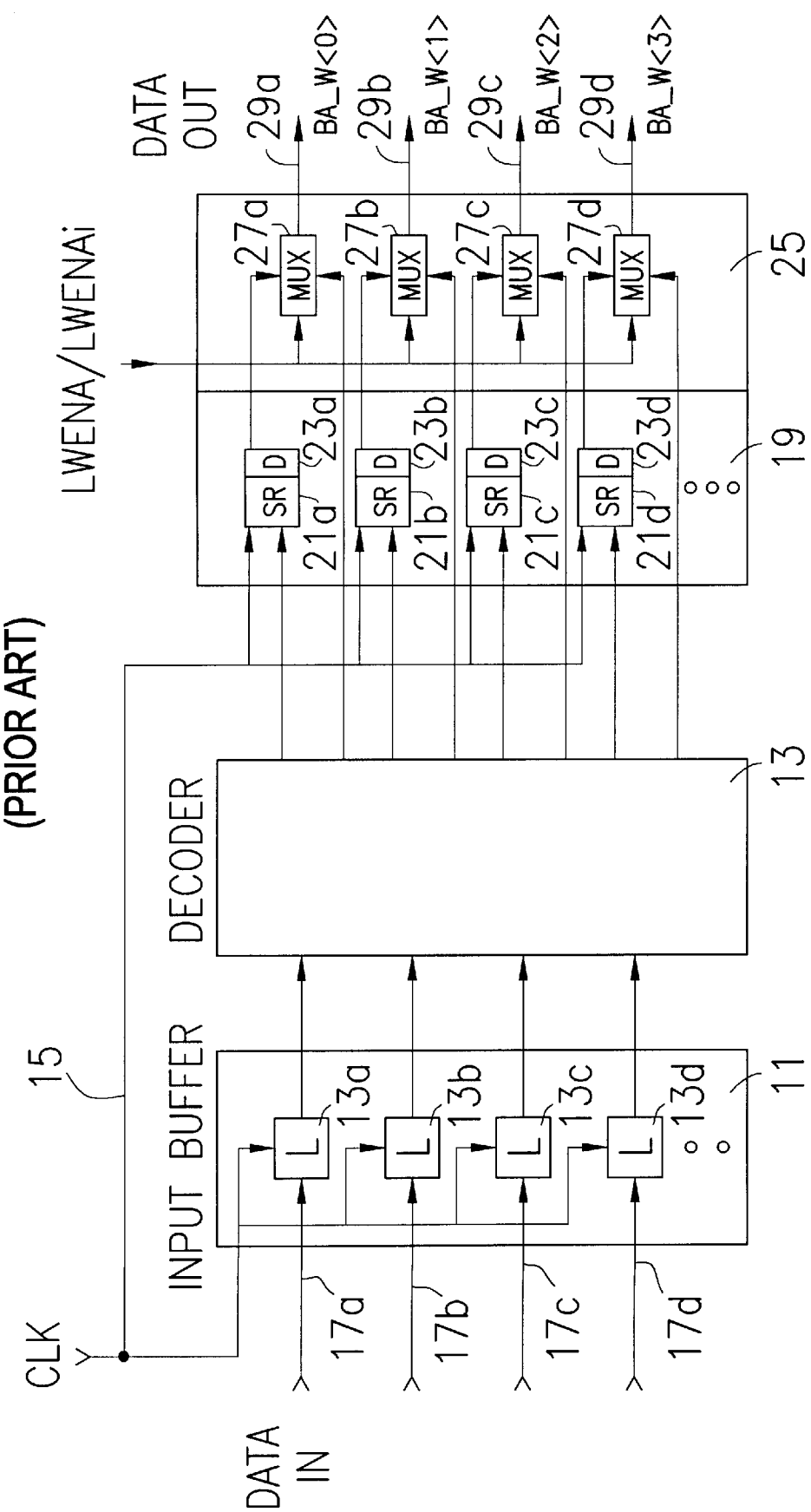
FIG. 1 illustrates a prior art double data rate peripheral logic circuit for retrieving and decoding bank select signals.
Figure 2:
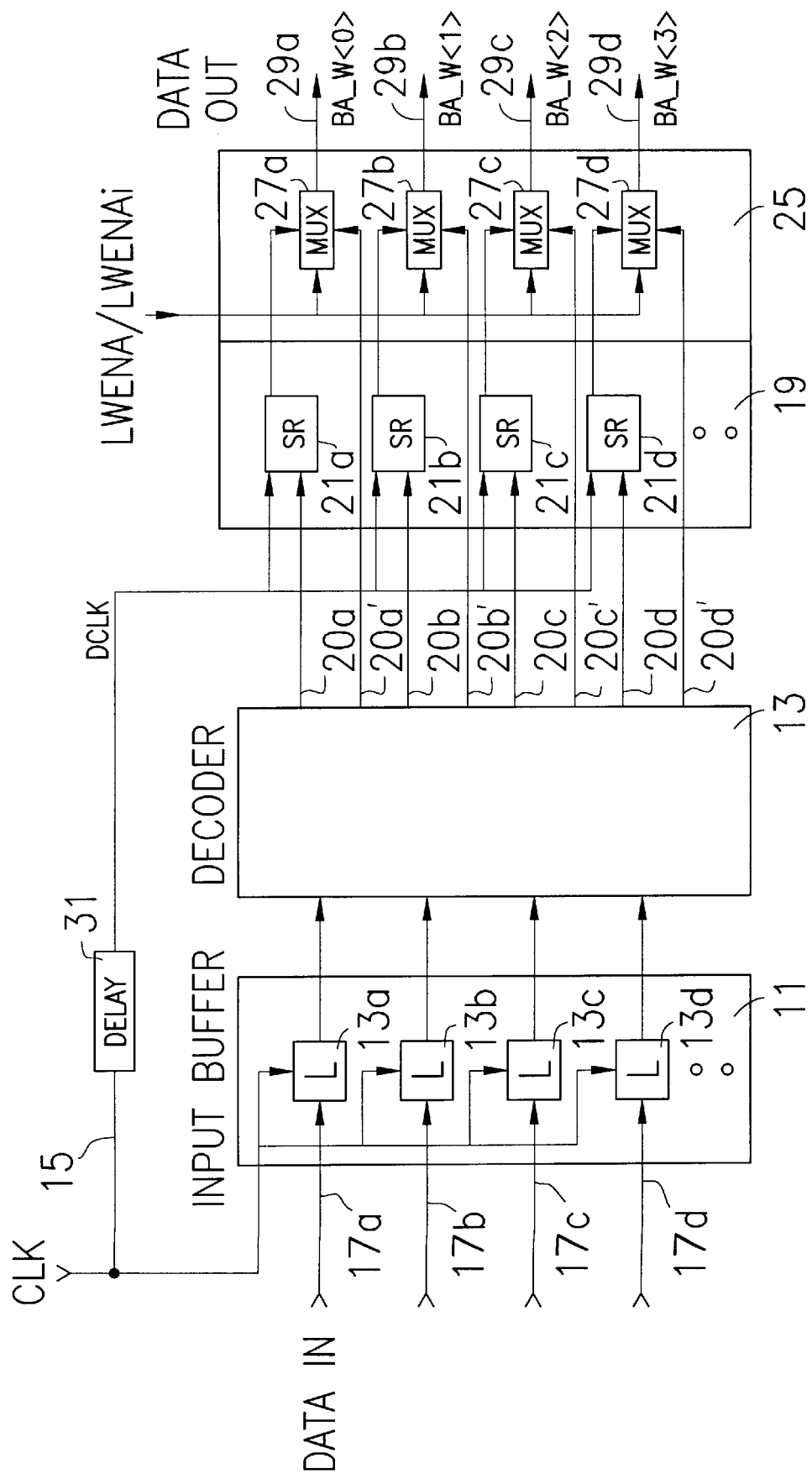
FIG. 2 is a circuit diagram similar to FIG. 1, but illustrating an improved circuit in accordance with an exemplary embodiment of the invention.

FIG. 2 illustrates an exemplary embodiment of the invention. FIG. 2 differs from FIG. 1 in that the delay elements 23a . . . 23d of FIG. 1 have been omitted. In addition, a delay element 31 has been added in the clock line 15 which supplies a delayed clock signal as the inputs to each of the shift register stages 21a . . . 21d. In all other respects, the FIG. 2 circuit is identical to the FIG. 1 circuit.

During a memory write operation, address data is applied as data input on lines 17a . . . 17d from a memory controller or other control device. The address data is clocked in by the clock signal CLK on line 15 and is latched in each of the latch elements 13a . . . 13d. This address data is decoded by decoder 13 which provides as output signals bank select signals BA_<0:3>. It should be noted that the same bank select signals are provided on a first output path 20a . . . 20d, and a second output path 20a' . . . 20d' for respective bank select signals BA_W<0:3>.

The first output signal path 20a . . . 20d is applied to a respective shift register 21a . . . 21d and from there to a respective multiplexer 27a . . . 27d. The second output signal paths 20a' . . . 20d' are respectively applied as the other inputs to multiplexers 27a . . . 27d. The multiplexers 27a . . . 27d operate as described above with respect to FIG. 1, and provide either a shifted or non-shifted decoded output signal on respective lines 29a . . . 29d in accordance with the logical state of the selection signal LWENA/LWENAi.

The delay element 31 provided in the clock path 15 provides each of the shift registers 21a . . . 21d of the shift register circuit 19 with a delayed clock signal DCLK. As a consequence, the data is clocked through the shift registers 21a . . . 21d after the delay provided by delay element 31. The output signals of each of the shift registers 21a . . . 21d in the FIG. 2 circuit is exactly the same as the output signals at each of the delay stages 23a . . . 23d of the FIG. 1 circuit. However, in the FIG. 2 embodiment, four delay elements have been replaced by a single delay element 31. In this manner, circuit complexity has been reduced and valuable die real estate has been saved.

It should be noted that while the FIG. 2 circuit has been illustrated for decoding address signals applied at the data input lines 17a . . . 17d, there is a similar circuit in memory devices for decoding command data, and the FIG. 2 circuit is applicable thereto as well. That is, command data from a command data bus can be applied on the input lines 17a . . . 17d, and decoded command data from a decoder 13 then appears at the output lines 20a, 20a', 20b, 20', 20c, 20c', 20d, 20d'. This decoded command data is then shifted by the shift register elements 21a . . . 21d by a delayed clock signal DCLK applied on line 15 which appears at the output of delay element 31. In this case, the data output lines 29a . . . 29d provide shifted and decoded command data for the memory device.

Figure 4:
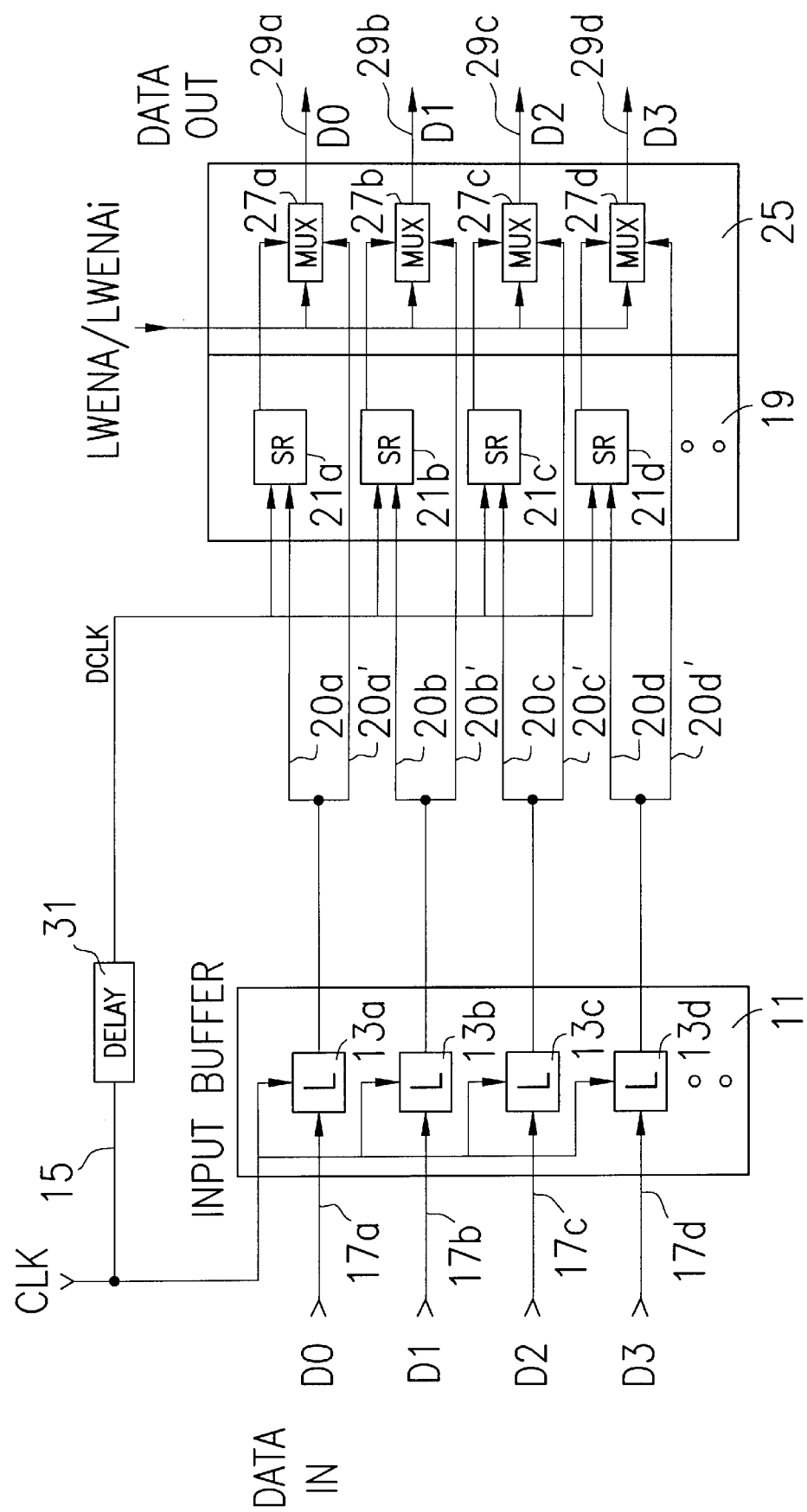
FIG. 4 is a circuit diagram similar to FIG. 2, but illustrating an improved circuit in accordance with an another embodiment of the invention.

The FIG. 2 circuit may also be used to shift the actual data which is to be written into a memory array, in which case the applied write data is applied to the data lines 17a . . . 17d in the manner shown in FIG. 4. In this case, however, a decoder 13 is not necessary and, instead, the output of the latch elements 13a . . . 13d is directly split into two data paths, one of which passes along paths 20a . . . 20d through an associated shift register 21a . . . 21d, and the other which is applied directly from path 20a' . . . 20d' to multiplex circuits 27a . . . 27d. Once again the applied data on path 20a . . . 20d is shifted by the shift registers 21a . . . 21d and shift circuit 19 in accordance with a delayed clock signal DCLK taken from the output of delay element 31.

As noted, the additional output paths 20a' . . . 20d' from decoder 13 in the FIG. 2 circuit or from latches 13a . . . 13d in the case of the FIG. 4 circuit which are connected to multiplexers 27a . . . 27d are provided for enabling data to bypass the shift registers 21a . . . 21d during a read operation of the memory device. In such an operation there is no need to delay the address data with the shift registers and, accordingly, the selection signal LWENA/LWENAi is used to operate the multiplexers 27a . . . 27d to select either the output of the shift register elements 21a . . . 21d during a write operation or to the data on paths 20a' . . . 20d' when a read operation occurs.

Figure 3:
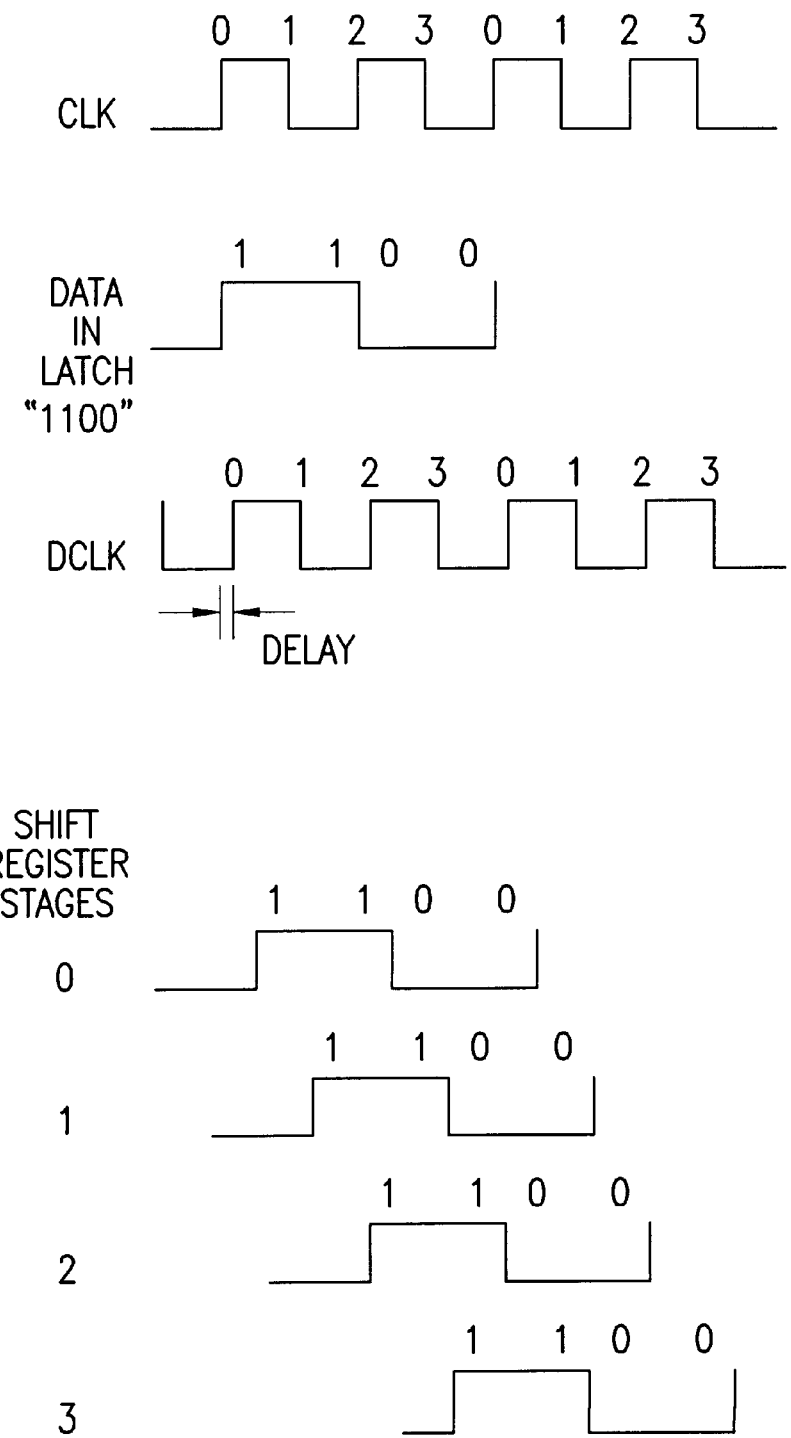
FIG. 3 is a timing diagram useful in explaining the invention.

FIG. 3 illustrates the relationship between the clock signal CLK for latching data into the input buffer 11 and the delayed clock signal CLK for shifting data through the shift registers 21a . . . 21d. Since the illustrated memory device is a double data rate device four shift register stages are required for each shift register to obtain a two clock cycle data shift. The clock signal CLK is shown at the top, and a "0" edge of the clock signal is used to latch in data at the latch elements 13a . . . 13d.

A corresponding "0" edge of the delayed clock signal DCLK at the output of delay element 31 is used to begin the shift of data through each of the four stages of the shift registers 21a . . . 21d. As shown in FIG. 3, four successive edges "0", "1", "2", "3" of the delayed clock signal DCLK are used to shift data through the four stages of each of the shift registers 21a . . . 21d.

It should be noted from FIG. 3 that the delay imparted by delay element 31 must be sufficient to enable the data which is latched in the buffer circuit 11 to be stable. Accordingly, the delay must at least be long enough for the latch data to be stable for a predetermined period of time. In addition, the delay cannot be too big such that the wrong data is passed into the shift register elements 21a . . . 21d. Stated otherwise, the delay must be less than the time at which the next loading of data occurs in buffer amplifier 11 by the next clock transition denoted 1 in FIG. 3. Within these constraints, the delay provided by delay element 31 can then be any value. In typical circuitry, the delay value is set between about 1 to about 3 nanoseconds.

Figure 5:
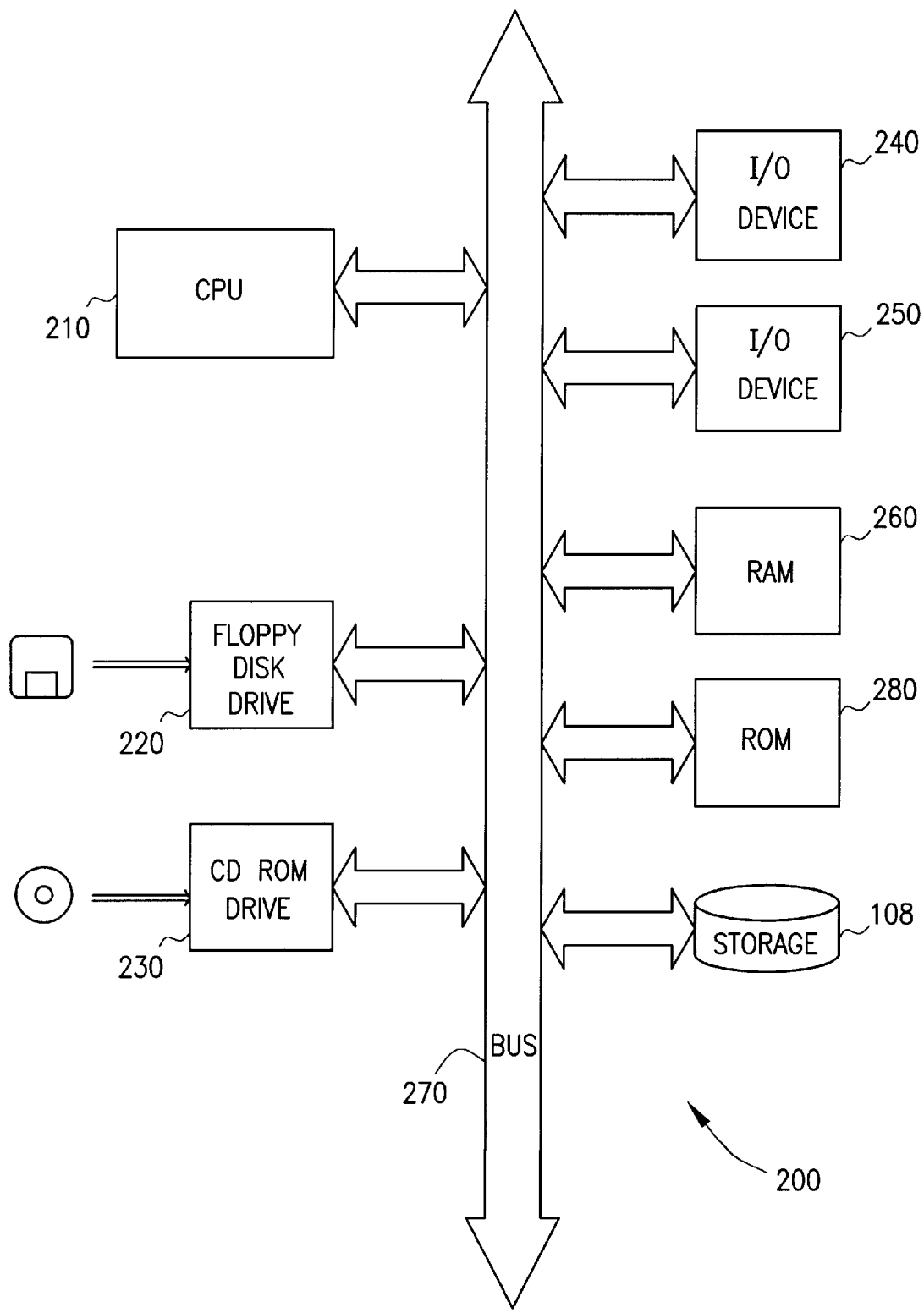
FIG. 5 is a block diagram of a processor system which employs the invention.

FIG. 5 illustrates a processor system which employs the invention. As shown in FIG. 5, a processor based system, such as a computer system, for example, generally comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and, in the case of a computer system may include peripheral devices such as a floppy disk drive 220 and a compact disk (CD) ROM drive 230 which also communicate with CPU 210 over the bus 270. At least RAM 260 is preferably constructed with one or more integrated circuit memory devices which each include a shift circuit previously shown and described with respect to FIGS. 2–4. It may also be desirable to integrate the processor 210 and memory 260 on a single IC chip.

Although the invention has been described above in connection with exemplary embodiments, it is apparent that many modifications can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method of operating a memory device, comprising:
   receiving data associated with a write operation of said memory device from an input buffer, said input buffer clocking data inputs thereto with a clock signal;
   producing output data associated with said write operation from said received data; and
   delaying the availability of said output data at an output terminal by passing said output data through a data shifting circuit which is clocked by a delayed said clock signal.

2. A method as in claim 1 wherein said received data is multi-bit data which is present on parallel lines of said input buffer and said act of producing produces parallel multi-bit output data, said shifting circuit having a plurality of shifting elements which respectively shift an associated bit of said multi-bit output data, said method further comprising clocking all said shifting elements with said delayed clock signal.

3. A method as in claim 2 wherein said received data is address data and said act of producing produces from said address data decoded bank select data as said output data.

4. A method as in claim 2 wherein said received data is command data and said act of producing produces from said command data decoded command data as said output data.

5. A method as in claim 2 wherein said received data is data to be written in a memory array and said act of producing passes said data to be written from said buffer as said output data.

6. A method as in claim 1 wherein said producing circuit produces output data on a first path and a second path, said act of delaying delaying output data on said first path, said method further comprising selecting one of the delayed output data from said first path and the output data on said second path in accordance with a selection signal.

7. A method as in claim 6 wherein said selection signal operates to select said first path when said memory device is performing a write operation and said second path when said memory device is performing a read operation.

8. A method as in claim 1 wherein said act of receiving receives said data from said input buffer after said data has been latched in said input buffer by said clock signal.

9. A method as in claim 1 wherein said memory device is a random access memory device.

10. A method as in claim 9 wherein said random access memory devices is a double data rate device where memory operations occur on each transition of a clock signal.

11. A method as in claim 1 wherein the delay for said delayed clock signal is selected to be in a range such that said clock signal is able to stably latch said received data in said input buffer and said output data, at least at a first stage of said shifting circuit, corresponds to latched data present in said input buffer.

12. A method as in claim 11 wherein said delay is in the range of about 1 ns to about 3 ns.

13. A method of operating a memory device comprising:
   latching first data associated with a write memory operation into an input buffer with a clock signal;
   decoding said first data in said input buffer into second data;
   shifting said second data in a shift register; and
   clocking said shift register with a delayed version of said clock signal.

14. A method as in claim 13 wherein a delay of said second clock signal is set such that said second data is shifted into a first stage of said shift register before new data is latched into said input buffer by said clock signal.

15. A method as in claim 13 wherein said first data is address data.

16. A method as in claim 15 wherein said second data is bank select address data.

17. A method as in claim 13 wherein said first data is command data.

18. A method as in claim 17 wherein said second data is decoded command data.

19. A method as in claim 13 wherein said memory device has a latency from the time said data is latched until a write memory operation can be performed, the number of stages of said shift register being approximately equal to said latency, said register shifting data in response to each edge of said delayed clock signal.

20. A memory device comprising:
   a clock signal line;
   an input buffer for receiving and latching input data associated with a write operation, said input buffer using a clock signal on said clock signal line to latch in said input data;
   a data path coupled to said input buffer for providing output data having a predetermined relationship to said input data;
   a data shifting circuit having a predetermined number of shifting stages for shifting output data on said data path; and
   a delay element for delaying a clock signal on said signal line and providing a delayed clock signal to shift data through said data shifting circuit.

21. A memory device as in claim 20 wherein said received data is multi-bit data which is present on parallel lines of said input buffer and said output data is multi-bit output data provided to parallel input lines of said data shifting circuit, said shifting circuit having a plurality of respective n-stage shifting elements, where $n \geq 1$, respectively associated with said parallel input lines, each of said shifting elements receiving said delayed clocking signal.

22. A memory device as in claim 21 wherein said input data is address data, said memory device further comprising an address decoder for decoding said address data into bank select output data.

23. A memory device as in claim 21 wherein said input data is command data, said memory further comprising a command decoder for decoding said command data into decoded command output data.

24. A memory device as in claim 21 wherein said input and output data is data to be written to a memory array.

25. A memory device as in claim 20 further comprising:
   a first output data path for said output data which passes through said data shifting circuit and a second output data path for said output data which bypasses said shifting circuit; and
   a selection circuit for selecting output data from one of said first and second data paths in response to a selection signal.

26. A memory device as in claim 25 wherein said selection signal selects said first output data path for a write operation of said memory device and said second output data path for a read operation of said memory device.

27. A memory device as in claim 20 wherein said memory device is a random access memory device.

28. A memory device as in claim 27 wherein said random access memory devices is a double data rate device where memory operations occur on each transition of a clock signal.

29. A memory device as in claim 20 wherein the delay for said delayed clock signal is selected to be in a range such that said clock signal is able to stably latch said received data in said input buffer and said output data, at least at a first stage of said shifting circuit corresponds to latched data present in said input buffer.

30. A memory device as in claim 29 wherein said delay is in the range of about 1 ns to about 3 ns.

31. A processor system comprising:

a processor; and a memory device coupled to said processor, said memory device comprising:

a clock signal line;

an input buffer for receiving and latching input data associated with a write operation, said input buffer using a clock signal on said clock signal line to latch in said input data;

a data path coupled to said input buffer for providing output data having a predetermined relationship to said input data;

a data shifting circuit having a predetermined number of shifting stages for shifting output data on said data path; and a delay element for delaying a clock signal on said signal line and providing a delayed clock signal to shift data through said data shifting circuit.

32. A processor system as in claim 31 wherein said received data is multi-bit data which is present on parallel lines of said input buffer and said output data is multi-bit output data provided to parallel input lines of said data shifting circuit, said shifting circuit having a plurality of respective n-stage shifting elements, where n≧1, respectively associated with said parallel input lines, each of said shifting elements receiving said delayed clocking signal.

33. A processor system as in claim 32 wherein said input data is address data, said memory device further comprising an address decoder for decoding said address data into bank select output data.

34. A processor system as in claim 32 wherein said input data is command data, said memory further comprising a command decoder for decoding said command data into decoded command output data.

35. A processor system as in claim 32 wherein said input and output data is data to be written to a memory array.

36. A processor system as in claim 31 further comprising:

a first output data path for said output data which passes through said data shifting circuit and a second output data path for said output data which bypasses said shifting circuit; and a selection circuit for selecting output data from one of said first and second data paths in response to a selection signal.

37. A processor system as in claim 36 wherein said selection signal selects said first output data path for a write operation of said memory device and said second output data path for a read operation of said memory device.

38. A processor system as in claim 31 wherein said memory device is a random access memory device.

39. A processor system as in claim 37 wherein said random access memory devices is a double data rate device where memory operations occur on each transition of a clock signal.

40. A processor system as in claim 31 wherein the delay for said delayed clock signal is selected to be in a range such that said clock signal is able to stably latch said received data in said input buffer and said output data, at least at a first stage of said shifting circuit corresponds to latched data present in said input buffer.

41. A processor system as in claim 40 wherein said delay is in the range of about 1 ns to about 3 ns.

* * * * *